United States Patent
Engelhardt et al.

(10) Patent No.: US 6,840,778 B2
(45) Date of Patent: Jan. 11, 2005

(54) CONTACT BASE WITH DETACHABLE CONTACTS FOR MAKING ELECTRICAL CONTACT WITH AN ELECTRONIC COMPONENT, IN PARTICULAR A MULTIPIN ELECTRONIC COMPONENT, AND MODULE CARRIER

(75) Inventors: Claus Engelhardt, München (DE); Jörg Kliewer, München (DE); Rupert Lukas, München (DE); Jan Spitz, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/340,464

(22) Filed: Jan. 10, 2003

(65) Prior Publication Data

US 2003/0129861 A1 Jul. 10, 2003

(30) Foreign Application Priority Data

Jan. 10, 2002 (DE) .......................................... 102 00 621

(51) Int. Cl.$^7$ ............................................... H01R 12/00
(52) U.S. Cl. .............................. 439/70; 439/73; 439/86
(58) Field of Search .............................. 439/70, 71, 73, 439/330, 331, 90, 91, 86

(56) References Cited

U.S. PATENT DOCUMENTS

| | | | |
|---|---|---|---|
| 3,982,159 A | * 9/1976 | Dennis et al. ................. | 439/71 |
| 4,164,003 A | * 8/1979 | Cutchaw ..................... | 439/331 |
| 4,678,255 A | 7/1987 | Carter | |
| 4,796,156 A | * 1/1989 | Webster ....................... | 439/70 |
| 4,878,846 A | * 11/1989 | Schroeder .................... | 439/73 |
| 5,800,194 A | 9/1998 | Yamagishi | |
| 5,829,988 A | 11/1998 | McMillan et al. | |
| 5,841,640 A | * 11/1998 | Shibata ........................ | 439/70 |
| 5,847,572 A | * 12/1998 | Iwasaki et al. ............... | 439/91 |
| 5,881,453 A | * 3/1999 | Avery et al. ................. | 439/331 |
| 5,975,915 A | * 11/1999 | Yamazaki et al. .......... | 439/331 |
| 6,057,700 A | * 5/2000 | Crispell ....................... | 439/73 |

FOREIGN PATENT DOCUMENTS

| | | |
|---|---|---|
| DE | 27 10 594 A1 | 9/1978 |
| DE | 37 06 507 A1 | 10/1987 |

OTHER PUBLICATIONS

Author not listed: "IC235 Series (Open Top)", Yamaichi Electronics, Munich, 4 pp. 89.

* cited by examiner

*Primary Examiner*—Tho D. Ta
(74) *Attorney, Agent, or Firm*—Laurence A. Greenberg; Werner H. Stemer; Gregory L. Mayback

(57) ABSTRACT

A frequent problem that arises in particular with regard to the analysis of memory components is that the memory components have to be tested under realistic conditions in a real application environment. In practice, such components are normally firmly soldered in on a module carrier. Owing to the thermal load during soldering, this solution cannot always be used and, furthermore, the contacts that are made should be detachable. Commercially available contact bases with detachable contacts cannot be used, however, since their dimensions are too large and they do not fit in the available surface area on the module carrier. The novel contact base is sufficiently small that a plurality of contact bases can be arranged closely one next to the other in a row in a very small space on a module carrier. The module carrier has plug contacts to be plugged into a commercial socket in order to make contact.

4 Claims, 3 Drawing Sheets

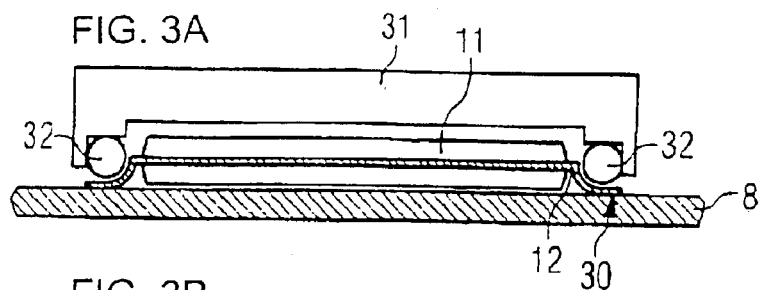
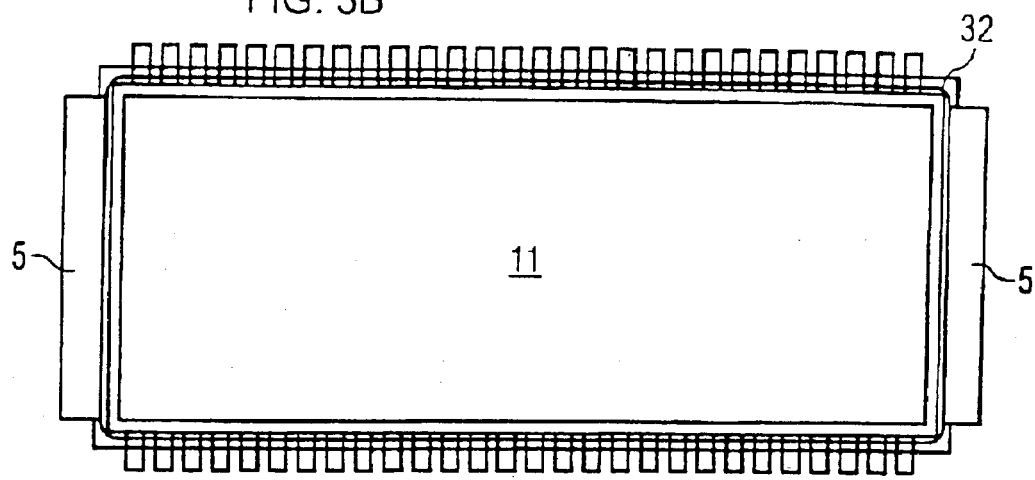
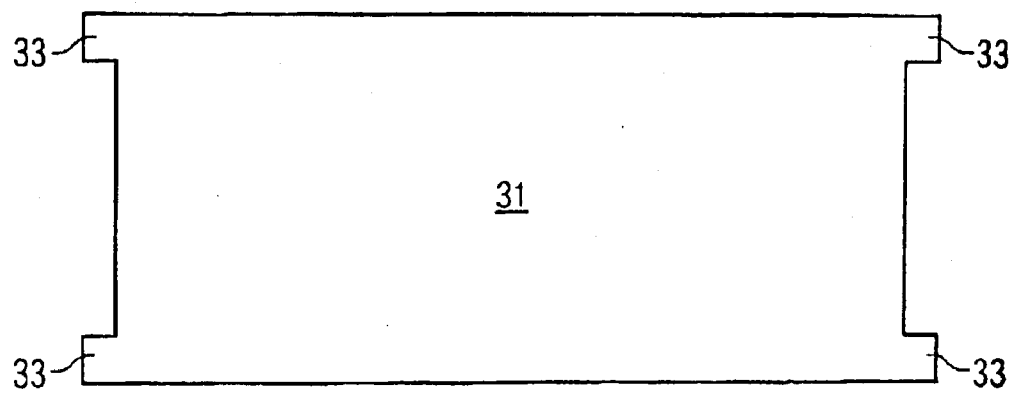
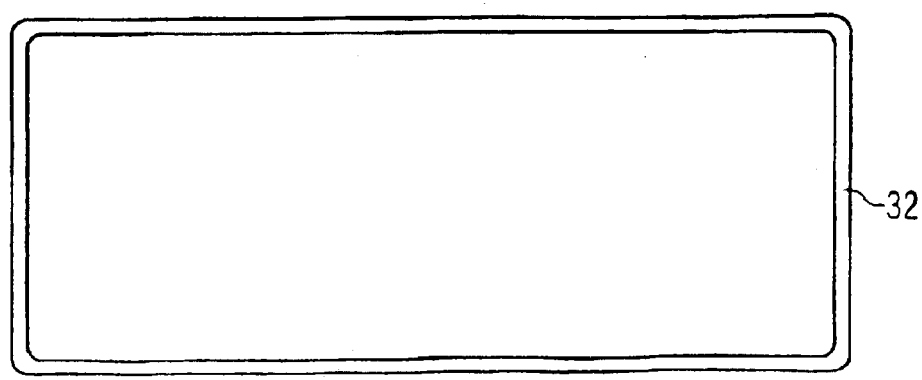

CONTACT BASE WITH DETACHABLE CONTACTS FOR MAKING ELECTRICAL CONTACT WITH AN ELECTRONIC COMPONENT, IN PARTICULAR A MULTIPIN ELECTRONIC COMPONENT, AND MODULE CARRIER

BACKGROUND OF THE INVENTION

Field of the Invention

The invention pertains to a contact base with detachable contacts for making electrical contact with an electronic component, in particular with a multipin electronic component. The contact base is preferably embodied as a slimline base. The invention further pertains to a module carrier for holding at least one such contact base. The module carrier is formed with plug-in locations for multipin components arranged closely one next to the other.

When analyzing components, in particular memory components such as SDRAMs, DRAMs (synchronous/dynamic random access memory), and the like, there is frequently the problem that the memory components have to be tested under realistic conditions in a real application environment. This may be necessary when, for example, the behavior of the memory components has to be tested in conjunction with a computer chip, with a new software program, and/or the memory component itself has to be tested for fault analysis. A memory component with, for example, a TSOP housing (thin small outline package) usually has a very large number of connecting contacts which are arranged very closely next to one another. In addition, a plurality of memory components are frequently connected together on a special circuit board such as a module carrier and are at the same time arranged very closely next to one another. For reasons of space, it is not possible to use commercially available contact bases on such a module carrier. It is also impossible to change the module carrier itself as it is designed, for example, with standardized connections for making contact with a commercially available motherboard of a computer.

Hitherto, in practice such components were firmly soldered or bonded, for example, onto the module carrier in order to avoid the above-mentioned problems. After analysis has been carried out, the components are generally desoldered, which is correspondingly costly. In addition, when the components are soldered or desoldered they are subjected to very high thermal loading which can have disadvantageous effects on the functioning and reliability of the components. Such a solution is therefore undesired. Furthermore, the contacts should be detachable in order to reduce the effort required for mounting. It is, however, not possible to use commercially available contact bases as they are too large in terms of their dimensions and do not fit onto the available surface of the module carrier.

SUMMARY OF THE INVENTION

It is accordingly an object of the invention to provide a contact base with detachable contacts for making electrical contact with an, in particular multipin, electronic component, or with the module carrier, which overcome the above-mentioned disadvantages of the heretofore-known devices and methods of this general type, and which simplify the way in which contact is made with multi-pin electronic components in a very small space.

With the foregoing and other objects in view there is provided, in accordance with the invention, a contact base assembly, comprising:

a contact base for supporting thereon an electronic component;
a plurality of detachable contacts for making electrical contact with the electronic component; and
the contact base having defined external dimensions so small (in comparison with a conventional contact base) to enable a plurality of contact base assemblies to be disposed closely adjacent one another in a row in a very small space on a module carrier.

The expression "conventional contact base" refers to conventional, standardized sockets. For example, the standard conventional contact base may be a Yamaichi socket of the IC235 series. The IC235 socket is used for TSOP housing.

In accordance with a preferred feature of the invention, therefore, the contact base is configured as a slimline base. Also, the system is preferably configured to receive a multi-pin electronic component.

In contrast with the prior art, the novel device has the advantage that the components to be tested can be positioned on the known module carrier without changes being necessary here. This is achieved in that the contact base according to the invention is of such small design in comparison with a commercially available contact base that it can be soldered or bonded directly onto the module carrier. The component is then plugged into this contact base and can advantageously be also removed again without effort. It is considered particularly advantageous here that the contact base can be of relatively simple design as it does not need to have the high stability under load and withstand the high plug insertion and withdrawal frequency as does a commercially available contact base which is used, for example, in the final testing of the encapsulated components. As a result, the contact base according to the invention can also be manufactured very cost-effectively.

With the above and other objects in view there is also provided, in accordance with an alternative embodiment of the invention, a contact base assembly, comprising:

a contact base for mounting an electronic component with contact pins directly to a module carrier formed with contact faces; and
a sprung pressure plate configured to press the contact pins of the electronic component against the contact faces of the module carrier;
the contact base having defined external dimensions so small in comparison with a conventional contact base to enable a plurality of contact base assemblies to be disposed closely adjacent one another in a row in a very small space on the module carrier.

With the above and other objects in view there is also provided, in accordance with the invention, a module carrier for mounting at least one contact base according to the above summary, comprising:

a plurality of closely arranged plug-in locations for multi-pin components on the module carrier;
a plurality of plug contacts adapted to be plugged into a commercially conventional contacting device to form electrical contacts; and
connections between the plug contacts and the plug-in locations for electrically connecting individual contact pins of the multi-pin components with the conventional contacting device.

It is considered particularly advantageous here that the contacts of the contact base are arranged in two rows of contacts which are opposite one another. This arrangement is particularly suitable for making contact with components in TSOP housings in which the contact pins extend out laterally and contact is made with them as they do. There is then space for the T-SOP housing between the two rows of contacts.

It also appears favorable to arrange the contacts on two contact carriers of the contact base which are arranged in the form of strips. The strip-shaped contact carriers can be made small and narrow and take up virtually only as much space as is required by the component with which contact is to be made. It is also advantageous to form the contact carriers with a boundary in order to facilitate the insertion of the component into the contact base and to ensure a better lateral hold.

A particularly simple structural measure is to secure the contact carriers by means of frame parts. The contact base is thus given the mechanical strength which is required for handling until the contact base is applied and secured to the module carrier. Afterward it serves as a practical insertion aid for the component. A holding clip or a pressure plate, for example, can also be attached to it in order to press the contact pins of the component against the contacts with the necessary force.

So that the contact pins of the component are also placed in reliable electrical contact with the contacts of the contact base, each contact of the contact base is embodied with a spring clip. As a result, mechanically conditioned differences between the individual contact pins of the component or even the individual contacts of the contact base are compensated. The component is thus contacted to an optimum degree in all cases.

It is also favorable to connect the spring clip by its free end to an associated conductor track of the module carrier. As a result, the spring clip can simultaneously easily itself assume the function of conducting current between the conductor track and the contact. There is then no longer any need for a separate connecting line.

The attachment of the spring clip to the conductor track can be made, dependent on requirements, by soldering or bonding. If there is good access to the connecting point, if for example the spring clip is attached directly on a conductor track or alternatively plugged through the module carrier or is to be connected to a conductor track on the rear, it is recommended to make the connection by soldering or welding. In other cases, if for example no excessively high temperature loads are expected later, the spring clips can alternatively also be secured with a suitable conductive adhesive.

One advantageous solution is also to provide the contact carriers with a laterally arranged recess. A spring ring, for example made of an elastic and insulating material such as rubber can advantageously be inserted into the recess for all the contacts. The spring ring then advantageously supports the spring force of the spring clip.

The solution of positioning the component with its contact pins on existing contact faces of the carrier module and pressing the contact pins against the contact faces by means of a sprung pressure plate is particularly advantageous. As a result, the structural embodiment of the contact base is further simplified as essentially only the sprung pressure plate and two frame parts are required for alignment.

The contact base appears particularly suitable for memory components which are packed in a T-SOP housing as the contact pins extend out laterally here.

In the case of the module carrier it is considered advantageous that it can be plugged into a contacting device of a motherboard of a computer. As a result, for example, the memory components in conjunction with the computer programs can be tested in a realistic application environment.

Other features which are considered as characteristic for the invention are set forth in the appended claims.

Although the invention is illustrated and described herein as embodied in a contact base with detachable contacts for making electrical contact with an, in particular multi-pin, electronic component and module carrier, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3A is a sectional elevational view illustrating a second exemplary embodiment of the invention;

FIG. 3B is a plan view onto a component with the pressure plate removed, in the second exemplary embodiment;

FIG. 3C is a plan view onto the pressure plate shown at the top of FIG. 3A;

FIG. 3D is a plan view onto a pressure ring used in the second exemplary embodiment.

DESCRIPTION OF THE PREFERRED EMBODIMENTS

Figure 1:
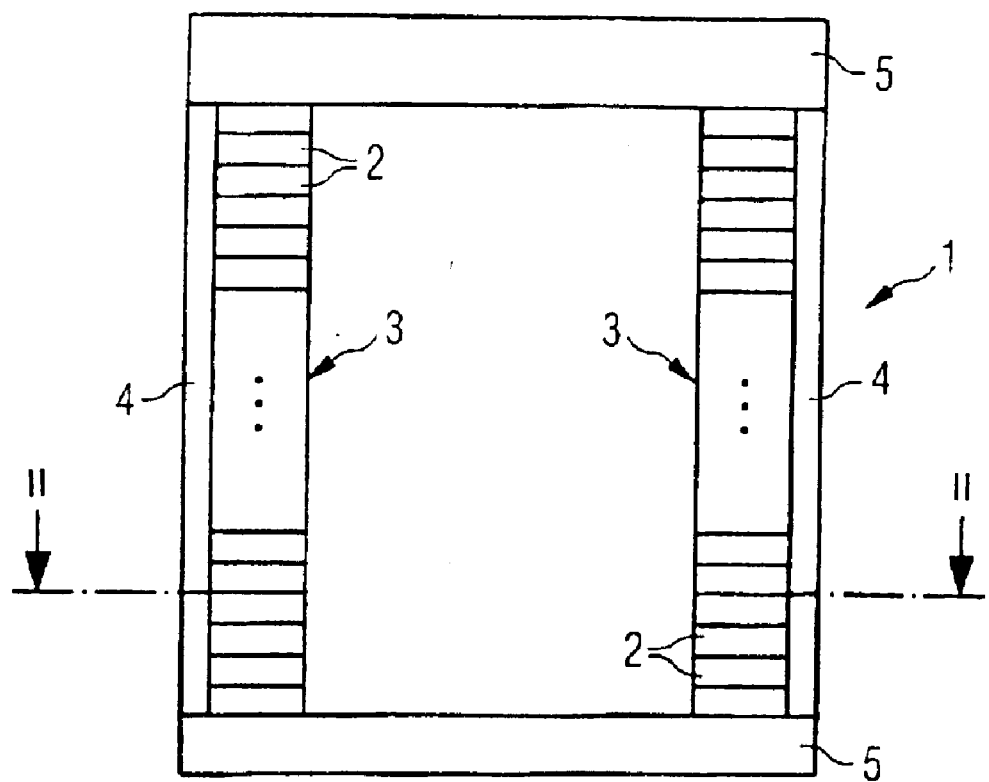
FIG. 1 is a plan view of a first exemplary embodiment of the invention.

Referring now to the figures of the drawing in detail and first, particularly, to FIG. 1 thereof, there is shown a first exemplary embodiment of the invention in which a contact base 1 is illustrated in a schematic, plan view. The contact base 1 is preferably embodied as a slimline base and is dimensioned in such a way that it takes up virtually no more area than is required for the component to be mounted with its connections. The contact base 1 is particularly embodied for components in a T-SOP housing and has a correspondingly large number of contacts 2. For example, a total of 54 contacts can be arranged in its two rows 3 of contacts. The contacts are divided into two contact rows 3, which lie opposite one another and each have 27 contacts. It will be understood that the number of contacts is dependent on the component 11 with which contact is to be made and can be appropriately adapted.

Figure 2:
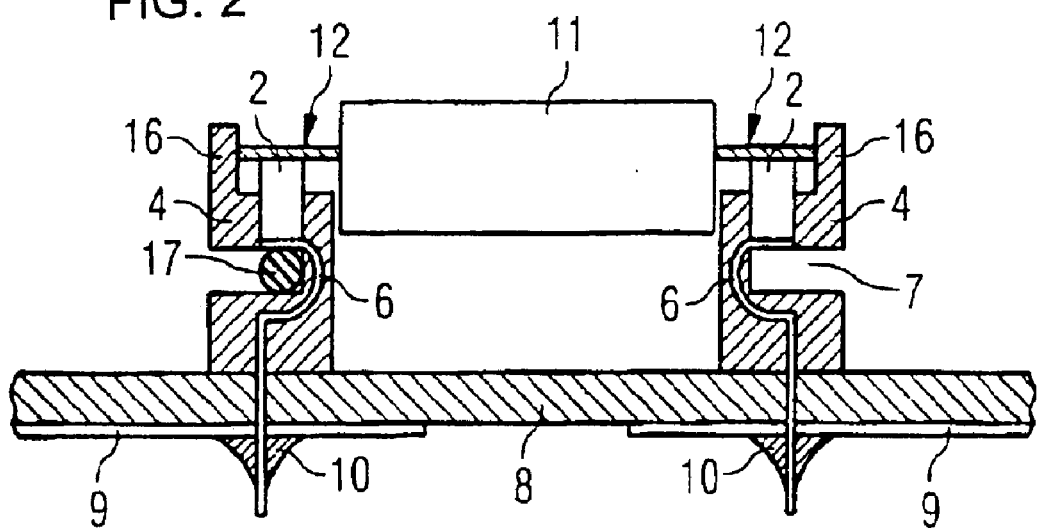
FIG. 2 is a cross section through the first exemplary embodiment taken along the section line II—II in FIG. 1 and viewed in the direction of the arrows.

As illustrated in FIG. 2, the two rows 3 of contacts are formed with contact carriers 4 on which the contacts 2 are arranged. The contacts 2 are each formed insulated from one another and are guided in a sprung manner in corresponding guides of the contact carriers 4. As is stated later with respect to FIG. 2, the contacts 2 are arranged in a vertically sprung fashion.

The two frame parts 5 are used to increase the mechanical strength of the contact base 1. However, they can also be used to hold a clamping clip or a pressure plate with which the contact pins 11 of the component 11 are pressed against the contacts 2 of the contact base 1. For reasons of clarity, these parts are however omitted from FIG. 1. The section line II—II is used to explain FIG. 2 illustrated in cross section.

In the cross section in FIG. 2, firstly a module carrier 8 can be seen on which a contact base 1 is applied. The module carrier 8 is embodied as a printed circuit board and is used, for example, to hold a plurality of contact bases 1 with its components 11. The two contact carriers 4, which have correspondingly formed guides for the contacts 2, can then be seen in the section view. The contacts 2 are formed in an electrically conductive fashion, preferably from metal. They are arranged in a movable fashion in guides with one degree of freedom, so that they can make a vertical movement. A spring clip 6 is arranged at the lower end of a contact 2 and its second end is conductively connected to a conductor track 9, to be connected, of the module carrier 8. This can be done by soldering, welding, bonding or the like.

According to FIG. 2, the spring clip 6 is guided through a bore hole in the contact carrier 8 and soldered to the conductor tracks 9 on the rear at the solder points 10. Of course, in an alternative embodiment of the invention, the soldering or bonding can also take place on the upper side of the module carrier 8. The illustrated element 10, therefore, may be understood as a solder or weld spot, or as an electrically conductive adhesive, or an equivalent thereof.

The two contact carriers 4 have a laterally formed recess 7 which is arranged underneath the contact 2. In order to increase the spring force of the spring clip 6, it is possible, for example, for a circumferential spring ring 17 to be inserted into this recess 7. The spring ring 17 is formed from an insulating and resilient material such as rubber and presses the contacts 2 upward.

The component 11 with which contact is to be made, for example a SDRAM with a T-SOP housing is inserted into the contact base 1 from above. Its contact pins 12 touch the contacts 2 which are arranged at the same distance and on a correspondingly formed contact face as the contact pins 12 of the component 11. In order to make good contact with a low contact resistance, the contact pins 12 are pressed onto the contacts 2 against the resistance of the spring clip 6 and, if appropriate, of the spring ring 17. This may be, for example, with a pressure plate, a clip or the like. However, these parts have been omitted from FIG. 2 for the sake of clarity.

In order to prevent the component 11 from slipping, the contact carriers 4 have lateral boundaries 16 so that the component 11 can be appropriately guided when it is inserted. The frame parts 5 can also be formed with a corresponding boundary.

FIGS. 3A to 3D show as an alternative solution a second exemplary embodiment of the invention which constitutes a further simplification of the contact base. The primary advantage in this exemplary embodiment is that, in accordance with FIG. 3A, the component 11 is pressed directly with its contact pins 12 onto existing contact faces 30 of the module carrier 8. The existing contact faces 30 are in practice the conductor tracks onto which the components 11 were earlier soldered or bonded. This configuration has the further advantage that the in particular capacitive disruptive effects due to the connecting pins are avoided so that this arrangement seems particularly suitable especially for high speed applications, for example with DDR (Double Data Rate) memories.

In order to secure the component 11 and the contacts, a sprung contact plate 31 is laid over the component 11. The spring effect is achieved here by means of an elastic pressure ring 32 such as is shown, for example, in FIG. 3D. The pressure ring 32 is composed for example of a rubber or a plastic such as is known, for example, by the trade name Viton®, sold by E. I. DuPont de Nemours. The ring 32 is inserted between the pressure plate 31 and the contact pins 12 of the component 11. The pressure plate 31 is embodied here in such a way that by pressing on it the contact pins 12 of the component 11 are pressed against the contact faces 30 of the module carrier 8.

FIG. 3B shows a plan view from which it is also apparent that frame parts 5, by which the component 11 is secured against lateral displacement in its expected position are arranged on the two narrow sides of the component 11. The frame parts 5 have previously been attached, for example by bonding, to the module carrier 8. They also have a recess for guiding the pressure ring 32. As is apparent from FIG. 3C, the pressure plate 31 has latching hooks 33 at its four corners. The latching hooks 33 are embodied in such a way that they hook into corresponding recesses in the frame parts 5. As a result, the component 11 is pressed by its contact pins 12 with a certain pressure against the contact faces 30 of the module carrier 8.

Figure 4:
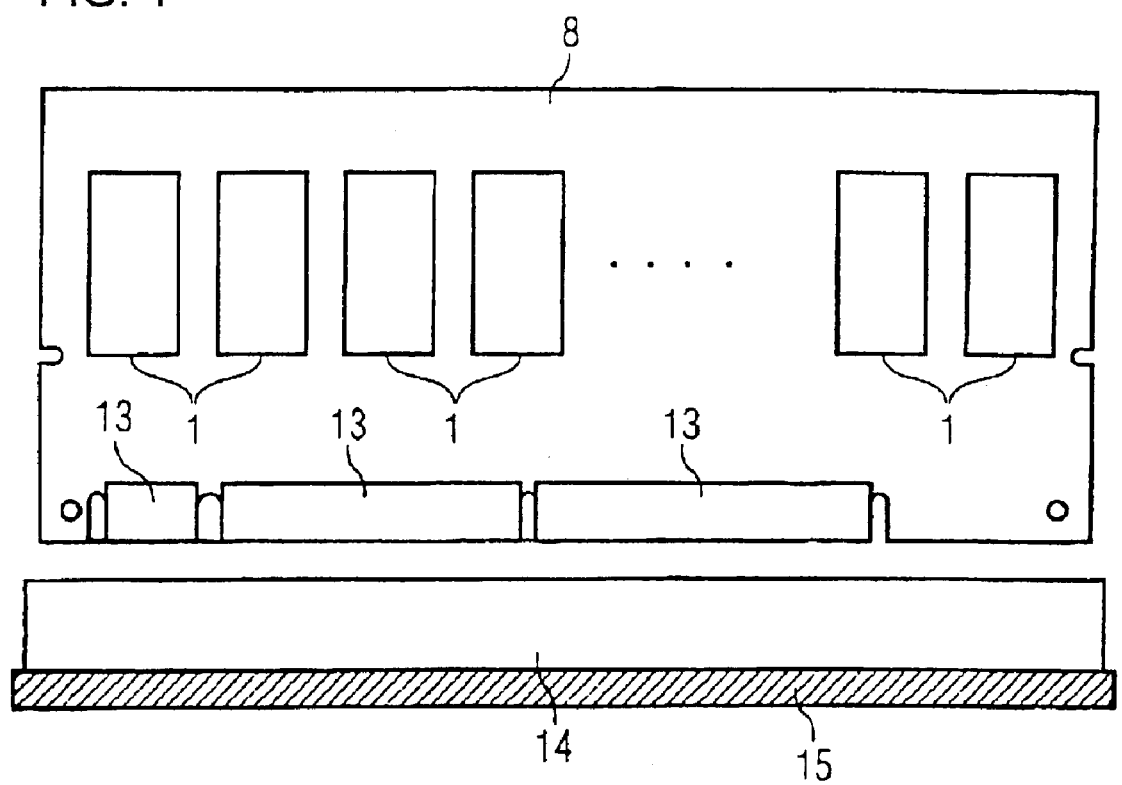
FIG. 4 is a schematic view of a module carrier according to the invention.

FIG. 4 shows a schematic view of a module carrier 8 such as is used for example as a memory module. The contact bases 1 are arranged here at the locations at which the components 11 are usually soldered in. The components 11 are inserted into the contact bases 1 so that the individual contact pins 12 are electrically connected to the corresponding conductor tracks 9 of the module carrier 8 (not shown in the drawing). The module carrier 8 has at least one row of plug contacts 13 at a suitable point. The plug contacts 13 are embodied here in such a way that they fit into a commercially available contacting device 14 and can be plugged in there. By means of notches or an asymmetrical arrangement, polarity reversal is prevented during the contact-making process. The commercially available contacting device 14 may be part of another printed circuit board, preferably a motherboard 15 of a computer.

We claim:

1. A contact base assembly, comprising:

a contact base for mounting an electronic component with two large sides and two narrow sides and contact pins directly to a module carrier formed with contact faces, the contact pins being disposed in two contact rows lying opposite one another on the two large sides of the electronic component; and a sprung pressure plate attached to said contact base and configured to press the contact pins of the electronic component against the contact faces of the module carrier;

said contact base having frame parts attached to the module carrier and disposed on the two narrow sides of the electronic component to secure the electronic component against lateral displacement;

said contact base having defined external dimensions so small to enable a plurality of contact base assemblies to be disposed closely adjacent one another in a row in a very small space on the module carrier.

2. The contact base assembly according to claim 1, wherein said contact base has small external dimensions in comparison with a conventional contact base.

3. The contact base assembly according to claim 1, wherein said frame parts of said contact base are formed with a laterally arranged recess for holding a pressure ring of said sprung pressure plate.

4. The contact base assembly according to claim 1, wherein said contact base is configured to hold a memory component in a TSOP (thin small outline package) housing.

* * * * *